United States Patent
Huang

(10) Patent No.: US 6,800,409 B2
(45) Date of Patent: Oct. 5, 2004

(54) SYSTEM AND METHOD FOR RECYCLING DEVELOPER SOLUTION CONTAINING TETRA-METHYL-AMMONIA HYDROXIDE (TMAH)

(75) Inventor: Chiao-Chung Huang, Taoyuan (TW)

(73) Assignee: AU Optronic Corp., Hsinchu (TW)

( * ) Notice: Subject to any disclaimer, the term of this patent is extended or adjusted under 35 U.S.C. 154(b) by 0 days.

(21) Appl. No.: 10/670,021

(22) Filed: Sep. 24, 2003

(65) Prior Publication Data

US 2004/0067453 A1 Apr. 8, 2004

(30) Foreign Application Priority Data

Sep. 27, 2002  (TW) ........................................ 91122294 A

(51) Int. Cl.[7] ............................. G03F 7/32; G03F 7/26; G03F 7/30; G03D 13/04; G01N 21/33

(52) U.S. Cl. ...................... 430/30; 430/327; 430/331; 396/578

(58) Field of Search ........................... 430/30, 327, 331; 396/578

(56) References Cited

U.S. PATENT DOCUMENTS 5,223,881 A  *  6/1993  Nakagawa et al.
6,302,600 B1 * 10/2001  Nagase et al.
6,752,545 B2 *  6/2004  Nakagawa et al.

* cited by examiner

Primary Examiner—Richard L. Schilling
(74) Attorney, Agent, or Firm—Thomas, Kayden, Horstemeyer & Risley

(57) ABSTRACT

A method and system of TMAH concentration adjustment. Absorption values A1, Y1 to Ym of a recycled developer solution at wavelength 210 nm and m wavelengths between 220 nm and 250 nm are measured respectively, wherein m is equal to or greater than 2. Y1 to Ym are input to an nth-degree polynomial to generate a wavelength-absorption relationship $Y=C_1X^n+ \ldots +C_{n-1}X+C_n$, wherein X is wavelength, n is a positive integer and $C_1$ to $C_n$ are coefficients of the relationship. Wavelength 210 nm is input into the wavelength-absorption relationship to generate an absorption value $Y_{210}$. A difference A3 between the A1 and $Y_{210}$ is calculated as the absorption value of TMAH in the developer solution and A3 is then input to an absorption calibration curve of TMAH at 210 nm to generate a corresponding TMAH concentration. TMAH is then added to provide the corresponding TMAH concentration.

18 Claims, 5 Drawing Sheets

SYSTEM AND METHOD FOR RECYCLING DEVELOPER SOLUTION CONTAINING TETRA-METHYL-AMMONIA HYDROXIDE (TMAH)

BACKGROUND OF THE INVENTION

1. Field of the Invention

The present invention relates to a recycling system for a semiconductor factory, and in particular to a recycling system and method for recycling a photoresist developer solution containing tetra-methyl-ammonia hydroxide (TMAH).

2. Description of the Related Art

In semiconductor fabrication, photolithography comprises the exposure and development of a photoresist layer overlying a semiconductor substrate to define a pattern thereon. Conventionally, the exposed acidic organic photoresist is neutralized and dissolved with basic developer and the unexposed photoresist pattern remains as a mask. Tetra-methyl-ammonia hydroxide (TMAH) is a widely used basic photoresist developer.

Conventionally, semiconductor factories recycle and reuse the basic TMAH developer by way of a recycling system. A conventional system utilizes a conductivity meter or a UV spectrometer to measure the concentration of TMAH in the recycled solution. The recycled solution is then adjusted to a predetermined alkaline level according to the measured concentration by adding additional TMAH thereto. The adjusted TMAH developer is then used as the photoresist developer of subsequent photolithography. After several recycles, the recycled TMAH developer is discharged to a waste system.

The quality of developer solution depends on the concentration of TMAH. However, the concentration of TMAH is influenced by ions in the recycled solution. For example, the neutralized compounds of photoresist and developer are ionized to generate $OR_1^-$, $OR_2^-$, or $(CH_3)_4NOR^+$ and the remaining metal ions $Al^{3+}$, $Mo^{2+}$, $K^+$, or $Na^+$ on the semiconductor substrates are rinsed in the developer. When a conductivity meter is utilized, the measured conductivity b % of a recycled developer solution is higher than the real conductivity a % due to the recycled solution containing ions other than basic TMAH. Since the TMAH concentration in the recycled solution exceeds estimated, the alkalinity, i.e. TMAH concentration, of the adjusted recycled solution is inaccurate.

When a UV spectrometer is utilized for TMAH adjustment, the absorption value of the recycled TMAH is influenced by the photoresist in the recycled solution. The measured absorption value is higher than the real absorption value of the TMAH therein. Similarly, the alkalinity of adjusted recycled solution is inaccurate.

It is difficult to eliminate the influence of other ions from the recycled solution using conductivity meter or UV spectrometer. Thus the accuracy of the adjusted TMAH concentration and the quality of subsequent photolithography are reduced.

A solution is to utilize high accuracy ion chromatography (IC) to isolate TMAH from the recycled solution for concentration determination, eliminating the influence of other ions and thus the exact concentration of TMAH is represented. The drawback of IC is its laboratory scale and batch-process concentration determination, making it unsuitable for continuous and long-term in-line analysis of TMAH recycling systems. In addition, the cost of materials used in ion chromatography and maintenance thereof are too high to be utilized in TMAH recycling systems.

SUMMARY OF THE INVENTION

The object of the present invention is to provide a rapid, economic, and accurate TMAH recycling system and method thereof able to measure TMAH concentration in the recycling system accurately such that alkalinity of TMAH in the recycled developer solution can be controlled.

The present invention provides a method for adjusting tetra-methyl-ammonia hydroxide (TMAH) concentration for recycling. M wavelengths are pre-selected between 220 nm and 250 nm, wherein m is equal to or greater than 2. Absorption values A1, Y1 to Ym of a recycled developer solution at wavelength 210 nm and m wavelengths between 220 nm and 250 nm are measured respectively. Y1 to Ym are input to an nth-degree polynomial to generate a wavelength-absorption relationship $Y = C_1 X^n + \ldots + C_{n-1} X + C_n$, wherein X is wavelength, n is a positive integer and $C_1$ to $C_n$ are coefficients of the relationship. Wavelength 210 nm is input into the wavelength-absorption relationship to generate an absorption value $Y_{210}$. A difference A3 between A1 and $Y_{210}$ is calculated as the absorption value of TMAH in the developer solution and A3 is then input to an absorption calibration curve of TMAH at 210 nm to generate a corresponding TMAH concentration. TMAH is then added into the recycled developer solution according to the corresponding TMAH concentration.

A recycling system of a developer solution containing TMAH is further provided according to the present invention. The recycling system comprises a recycle tank to collect the recycled developer solution from a photoresist development system via a recycle pipeline. An adjustment tank is coupled to the recycle tank for loading with highly concentrated TMAH and connected to the recycle tank with an adjustment pipeline. A spectrometer is coupled to the recycle tank for measuring absorption values of the developer solution in the recycle tank. A processor connects to the spectrometer and the adjustment pipeline, programmed to calculate a TMAH concentration in the recycle tank according to the measured absorption values from the spectrometer and delivering an amount of highly concentrated TMAH from the adjustment pipeline to the recycle tank to achieve a desired TMAH concentration according to the calculated TMAH concentration. The processor is programmed to calculate the TMAH concentration in the recycle tank by the following steps. Absorption values Y1 to Ym on m wavelengths between 220 nm and 250 nm of the recycled developer solution are read respectively, wherein m is equal to or larger than 2, and an absorption value A1 on 210 nm is also read. Y1 to Ym are then input to an nth-degree polynomial to generate a wavelength-absorption relationship $Y = C_1 X^n + \ldots + C_{n-1} X + C_n$, wherein X is wavelength, n is a positive integer and $C_1$ to $C_n$ are coefficients of the relationship. Wavelength 210 nm is input into the wavelength-absorption relationship to generate an absorption value $Y_{210}$. A difference A3 between the A1 and $Y_{210}$ is calculated as the absorption value of TMAH in the developer solution. A3 is input to an absorption calibration curve of TMAH at 210 nm to generate a corresponding TMAH concentration in the recycle tank.

When a recycling system achieves stability, the present invention further provides a simplified method for recycling a developer solution containing tetramethyl-ammonia hydroxide (TMAH). Absorption values A1 and A2 of the recycled developer solution are measured at wavelengths 210 nm and 220 nm. Absorption value A3 of TMAH in the developer solution is calculated as A3=A1−A2×Co, wherein Co=(A1'−A3')/A2', A1' and A2' are absorption values of a recycled developer solution with known TMAH concentration at wavelengths 210 nm and 220 nm respectively, and A3' is the standard absorption value of the known TMAH concentration at 210 nm. A3 is input to an absorption calibration curve of TMAH at 210 nm to generate a corresponding TMAH concentration. TMAH is added into the recycled developer solution accordingly, thereby achieving a desired TMAH concentration.

The present invention also provides a processor utilized in the above recycling system, programmed to calculate the TMAH concentration in the recycle tank by the following steps. Absorption values A1 and A2 of the recycled developer solution at wavelengths 210 nm and 220 nm are read. An absorption value A3 of TMAH in the developer solution is calculated by A3=A1−A2×Co, wherein Co=(A1'−A3')/A2', A1' and A2' are absorption values of a recycled developer solution with known TMAH concentration at wavelengths 210 nm and 220 nm respectively, and A3' is the standard absorption value of the known TMAH concentration at 210 nm. A3 is input to an absorption calibration curve of TMAH at 210 nm to generate a corresponding TMAH concentration in the recycle tank.

According to the present invention, a low cost and highly stable spectrometer is utilized by way of a processor, such as a computer, with which TMAH concentration in the recycle tank is computed and adjusted accurately.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1:
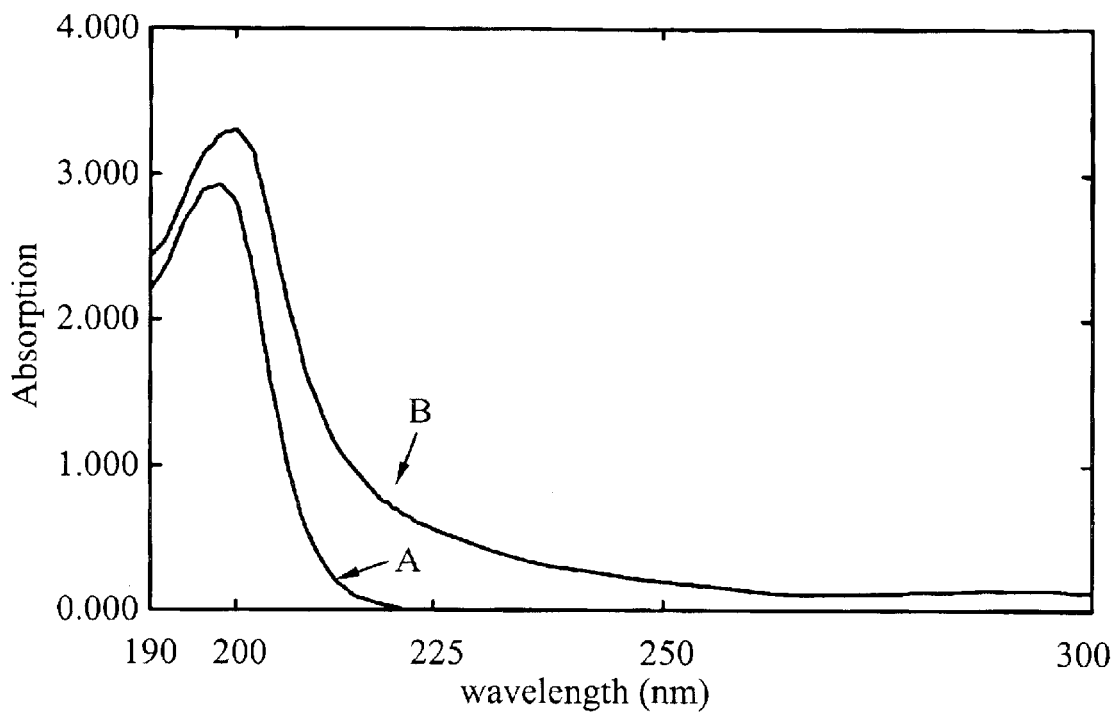
FIG. 1 shows absorption spectra of fresh and recycled TMAH developer solutions respectively according to the first embodiment of the invention.

FIG. 1 shows absorption spectra of fresh and recycled TMAH developer solutions respectively, according to the first embodiment of the invention. Curve A and curve B represent the absorption spectra of fresh and recycled TMAH developer solutions at wavelength 190 nm to 300 nm respectively. As shown in FIG. 1, there is no absorption of fresh TMAH solution at wavelength 220 nm or higher. The absorption spectra of fresh and recycled TMAH increase proportionally at wavelengths from 225 nm to 200 nm. The absorption of curve B is greater than curve A due to the influence of other ions; such as ionized photoresist or metal ions, in the recycled solution.

Figure 2:
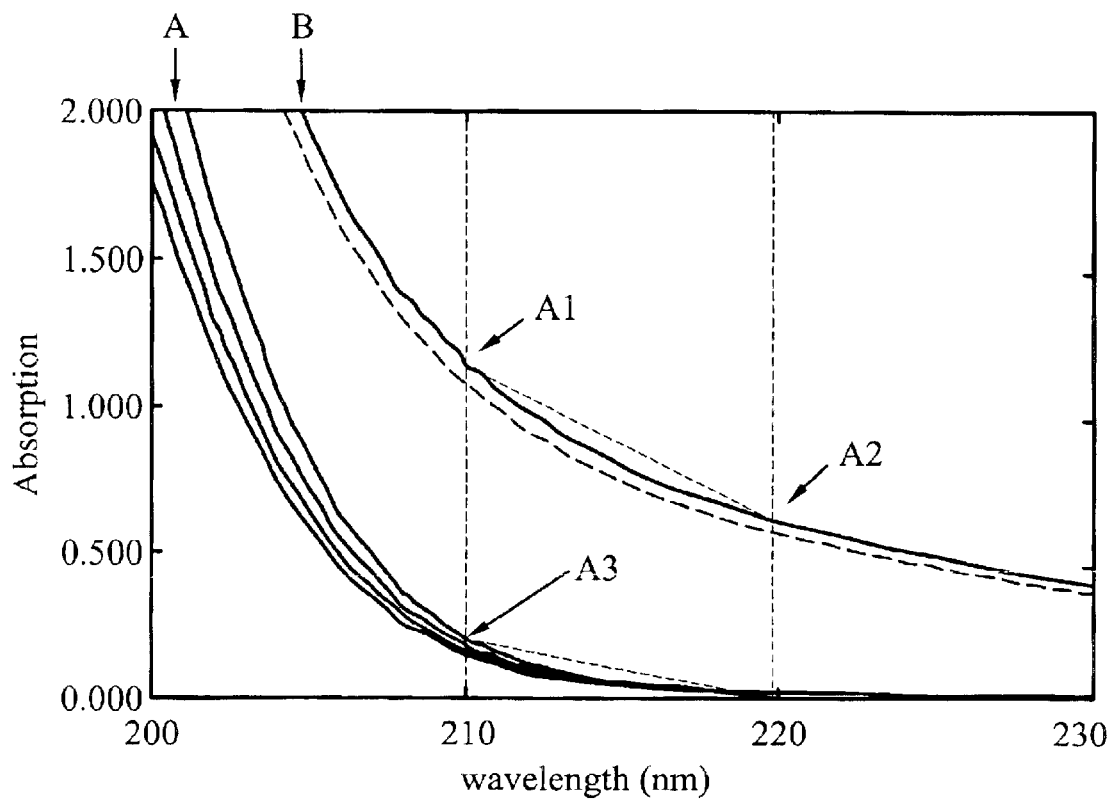
FIG. 2 shows absorption spectra of fresh and recycled TMAH developer solutions at wavelengths between 200 nm to 230 nm respectively according to the first embodiment of the invention.

FIG. 2 shows absorption spectra of fresh and recycled TMAH developer solutions at wavelengths between 200 nm to 230 nm respectively according to the first embodiment of the invention. The absorption curves of fresh TMAH with various concentrations of 2.08%, 2.15%, 2.24% and 2.36%, region A, deviate only slightly from one another. There is no absorption of the fresh TMAH solution at wavelength of 220 nm or higher. However, absorption spectrum (region B) is still detected for recycled TMAH containing other ions at wavelength higher than 220 nm. The absorption spectra of fresh and recycled TMAH show a proportional decrease from 210 nm to 220 nm, even with various TMAH concentrations.

Figure 3:
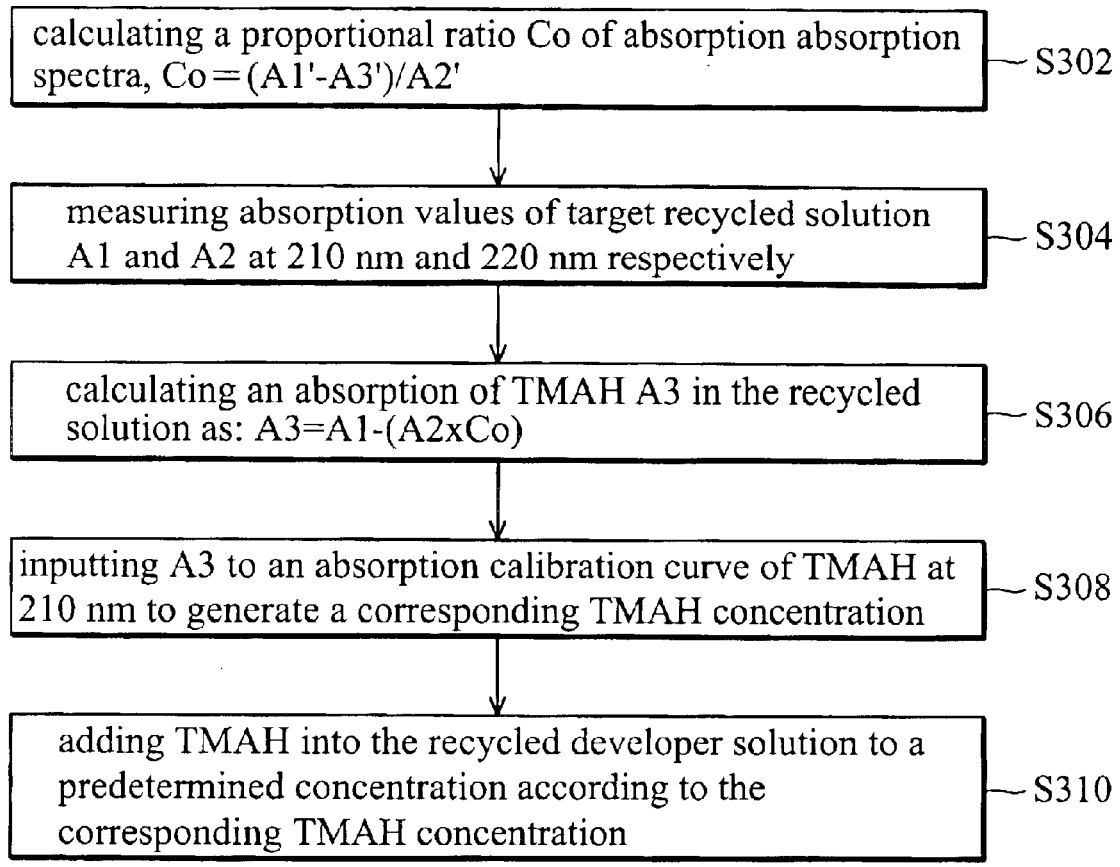
FIG. 3 is a flowchart of the method for recycling a TMAH developer solution according to the first embodiment of the invention.

According to the absorption profiles shown in FIGS. 1 and 2, a method for recycling TMAH solution according to the invention is further described with reference to FIG. 3.

When a recycling system is stable, the absorption spectra of the recycled and fresh TMAH solutions at 210 nm to 220 nm are proportional as shown in FIG. 2. TMAH concentration in the recycled developer solution can be computed according to the proportional ratio Co of absorption spectra of a standard TMAH solution and the recycled developer solution containing TMAH. As shown in FIG. 3, a proportional ratio Co of absorption spectra is calculated in step 302, wherein Co=(A1'−A3')/(A2'−A4').

As shown in FIG. 2, A1' and A2' are absorption values of a recycled developer solution with a known TMAH concentration at wavelengths 210 nm and 220 nm respectively. A3' and A4' are the absorption values of a standard TMAH solution with a known concentration at 210 nm and 220 nm respectively. Since the absorption of standard TMAH solution at 220 nm is zero or negligible, A4' can be omitted as Co=(A1'−A3')/A2'.

To compute Co, a series of standard TMAH solutions on 210 nm is detected to build an absorption calibration curve as $TMAH_{210}$ concentration-absorption curve, a relationship of various standard TMAH concentrations and the corresponding absorption values thereof. A recycled solution is detected at 210 nm and 220 nm respectively to obtain corresponding absorption values A1' and A2'. The accurate TMAH concentration in the recycled solution is further detected with an analysis instrument, such as ion chromatography, or an assay. The absorption value A3' of the accurate TMAH concentration in the recycled solution can be computed based on the $TMAH_{210}$ concentration-absorption calibration curve. Therefore, Co can be computed according to the absorption values, A1', A2' and A3'.

After Co is computed, absorption values of target recycled solution A1 and A2 are measured at 210 nm and 220 nm respectively, in step S304. A conventional spectrometer can be utilized to measure the absorption of the recycled solution in the recycle tank. If any detected absorption value exceeds 1.2, the recycled solution sample is diluted and then measured again.

The absorption of TMAH A3 in the recycle solution is calculated in step S306 as follows:

$$A3=A1-(A2 \times Co)$$

As shown in FIG. 2, when the recycling system is stable, the absorption difference between the recycled solution and TMAH standard solution at 210 nm, (A1–A3), is proportional to the absorption value of the recycled solution, A2, on 220 nm. Thus, when A1, A2 and Co are known, A3 can be computed accordingly as the absorption value of TMAH in the recycled solution.

In step S308, a corresponding concentration of TMAH absorption value A3 is computed based on a standard calibration curve of TMAH concentration and absorption thereof. In an embodiment, A3 is input to the $TMAH_{210}$ concentration-absorption calibration curve built in S302 to compute the corresponding TMAH concentration. If the absorption of the recycled solution is a diluted value, the actual concentration of TMAH in the recycled solution is returned according to the dilution ratio.

After the actual concentration of TMAH in the recycled solution is computed, an amount of TMAH is added into the recycled solution to achieve a desired TMAH concentration in step S310. Since TMAH is consumed during the development process, the TMAH concentration in the recycled solution is normally below the required TMAH concentration. According to the actual TMAH concentration computed in the above steps, the amount of supplemental TMAH for the recycled solution can be calculated according to the actual TMAH concentration and the volume of the recycled solution. Preferably, highly concentrated TMAH solution is added into the recycled solution for adjustment to a concentration of about 2.36%. Finally, the adjusted recycled solution is re-used for the subsequent development process.

When a recycling system of the developer solution achieves a steady operation, the above steps provide a readily available solution to adjust the recycled TMAH concentration. A standard calibration curve of a series of TMAH solutions is preset at 210 nm as a concentration-absorption calibration curve. The recycled solution is preliminarily sampled and measured to compute Co. After that, TMAH concentration in any batch of recycled solution can be adjusted by measuring the absorption values of the recycled solution at 210 nm and 220 nm and calculating according to the above steps.

Second Embodiment

Figure 5:
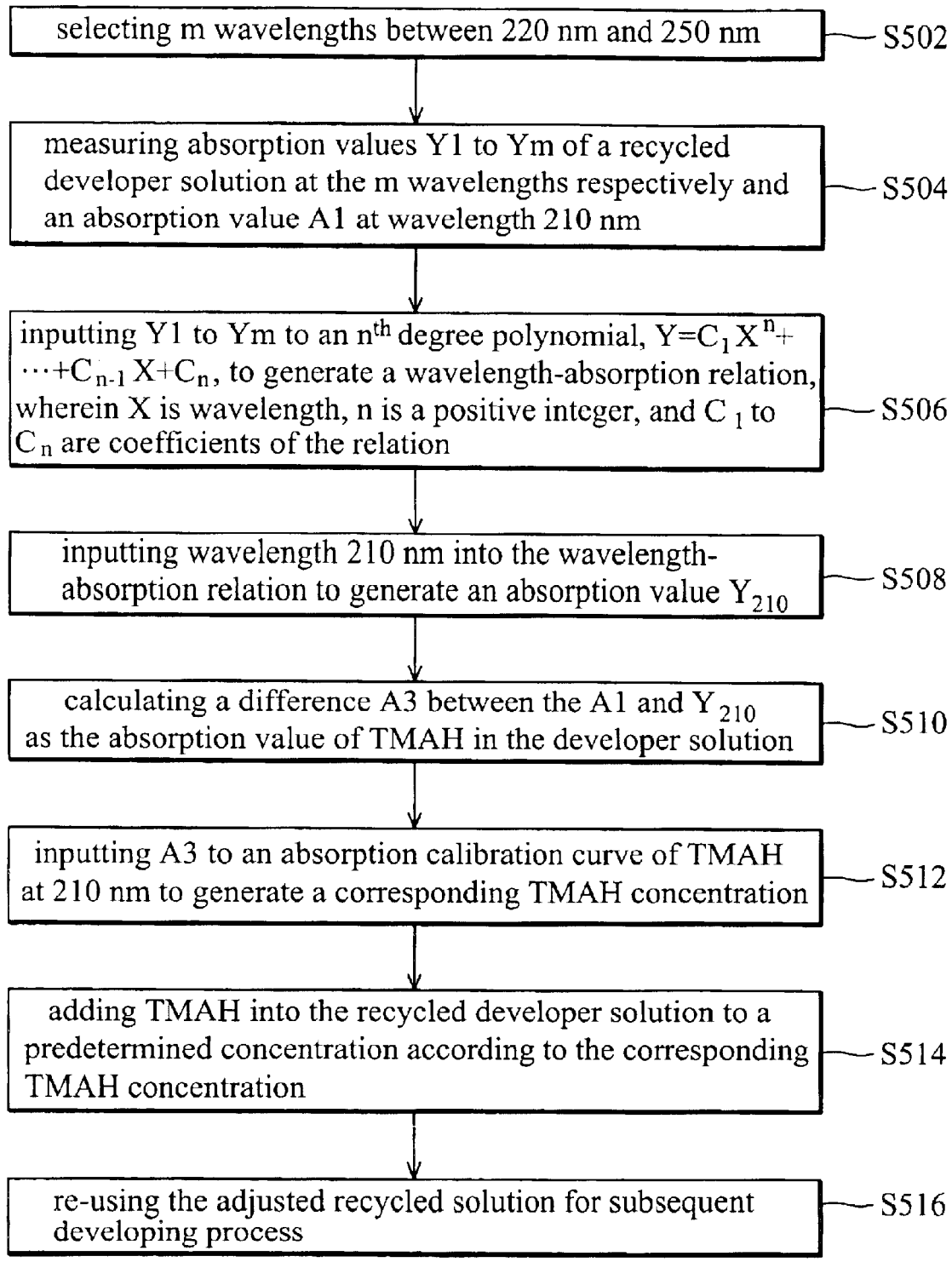
FIG. 5 is a flowchart of the method for recycling a TMAH developer solution according to the second embodiment of the invention.

To more accurately estimate TMAH concentration in the recycled solution, FIG. 5 shows a method of recycling a TMAH developer solution according to another embodiment of the invention.

Figure 4:
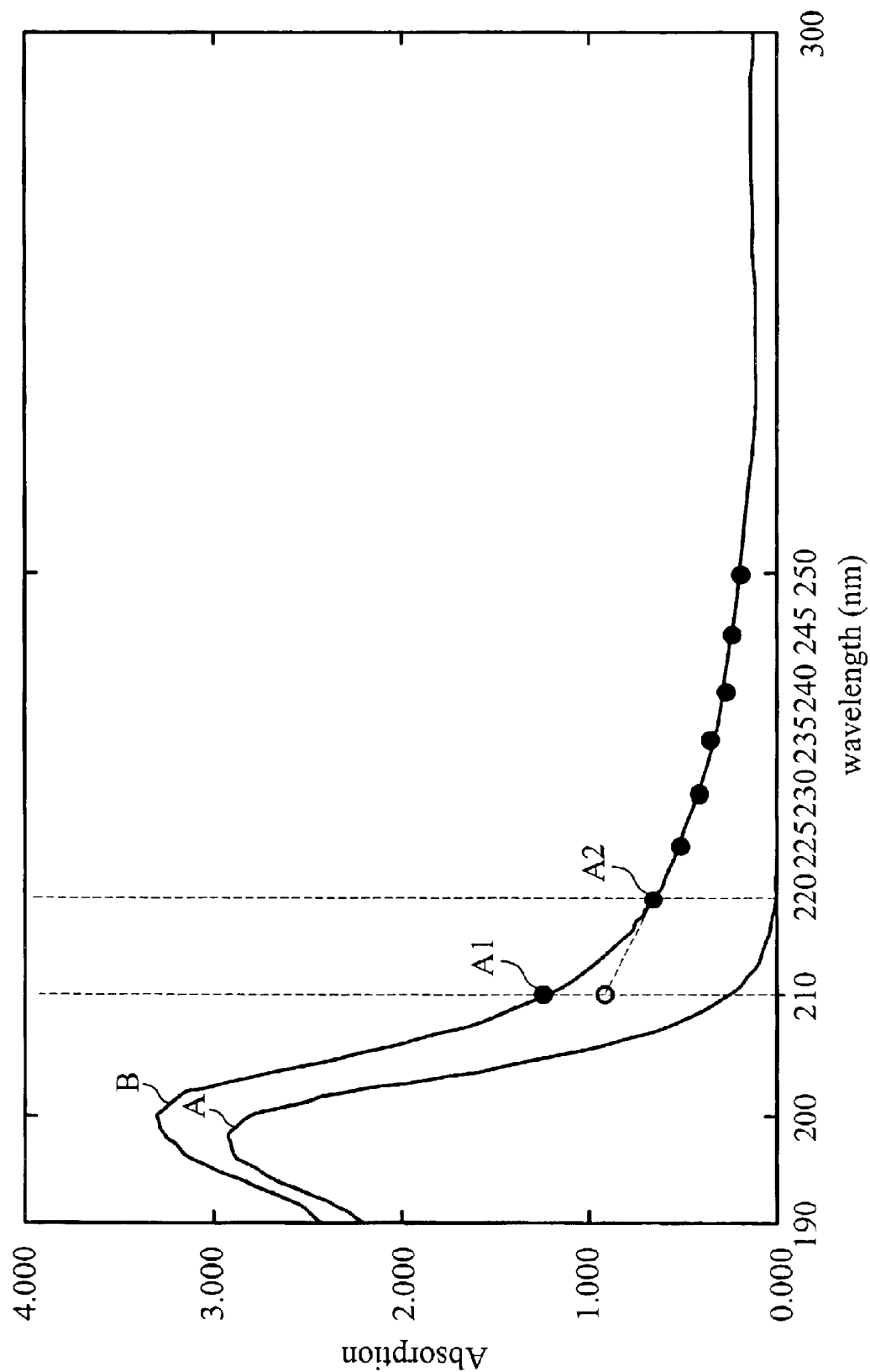
FIG. 4 shows absorption spectra of fresh and recycled TMAH developer solutions respectively utilized in the second embodiment of the invention.

As shown in FIG. 4, curve A, there is no absorption of TMAH standard solution at 220 nm or higher. The absorption of the recycled solution, curve B, on 220 nm or higher than is caused by contaminant ions in the recycled solution, such as ionized photoresist or metal ions. The present invention provides an absorption spectrum of the recycled solution at wavelength 220 nm or higher. The absorption of the recycled solution without TMAH at 210 nm is extrapolated accordingly. The absorption of TMAH in the recycled solution is then computed and thus concentration thereof is estimated.

M wavelengths are pre-selected between 220 nm and 250 nm in step S502, wherein m is equal to or greater than 2. Preferably, the m wavelengths are selected with an interval of 5 nm or 10 nm. As shown in FIG. 4, the m wavelengths are selected here as 7 wavelengths of 220 nm, 225 nm, 230 nm, 235 nm, 240 nm, 245 nm and 250 nm, because there is no absorption of TMAH at 220 nm or higher than and the absorption spectrum of the recycled solution tends to flatten above 250 nm. Thus, the absorption spectrum on 220 nm to 250 nm is the preferred curve representing the absorption tendency of contaminant ions in the recycled solution.

Absorption values A1, Y1 to Ym of a recycled developer solution at wavelength 210 nm and m wavelengths between 220 nm and 250 nm are measured respectively in step S504. If the measured absorption on 210 nm is greater than 1.2, the recycled developer solution is diluted and re-measured again to obtain A1, Y1 to Ym.

Y1 to Ym are input to an nth-degree polynomial to generate a wavelength-absorption relationship, $Y=C_1X^n+\ldots+C_{n-1}X+C_n$, in step S506, wherein X is wavelength, n is a positive integer and $C_1$ to $C_n$ are coefficients of the relationship. The degree n can be determined according to the m wavelengths. The preferred nth-degree polynomial is a 2nd- to 5th-degree polynomial. The more preferred nth-degree polynomial is a 3rd-degree polynomial as in $Y=C_1X^3+C_2X^2+C_3X+C_4$. The wavelengths 220 nm, 225 nm, 230 nm, 235 nm, 240 nm, 245 nm, 250 nm and the corresponding absorption values are input into the 3rd-degree polynomial, $Y=C_1X^3+C_2X^2+C_3X+C_4$, to obtain coefficients $C_1$ to $C_n$, thereby building a wavelength-absorption relationship of the contaminant ions in the recycled solution.

Wavelength 210 nm is then input into the wavelength-absorption relationship to obtain absorption $Y_{210}$ in step S508. Since the wavelength-absorption relationship obtained in step S506 represents the absorption curve of the contaminant ions in the recycled solution, the absorption of contaminant ions $Y_{210}$ is computed by substituting X=210 nm into the equation, $$Y=C_1X^3+C_2X^2+C_3X+C_4.$$

A difference A3 between A1 and $Y_{210}$, is calculated as the absorption value of TMAH in the developer solution in step 510.

A3 is then input to an absorption calibration curve of TMAH at 210 nm to generate a corresponding TMAH concentration in the recycled solution in step S512. The absorption calibration curve of TMAH at 210 nm can be preset by measuring absorptions of standard TMAH solutions with a series of concentrations. If the absorption of the recycled solution is a diluted value, the actual concentration of TMAH is returned according to the dilution ratio.

After the actual concentration of TMAH in the recycled solution is computed, an amount of TMAH is added into the recycled solution to achieve a desired TMAH concentration in step S514.

Finally, the adjusted recycled solution is re-used for the subsequent development process in step S516.

According to the above method, the adjustment of TMAH in the recycled solution can be achieved by measuring the absorptions of the recycled solution at 210 nm, 220 nm, 225 nm, 230 nm, 235 nm, 240 nm, 245 nm and 250 nm. The actual concentration of TMAH in the recycled solution can be computed according to the above steps. The TMAH concentration in the recycled solution can be adjusted thereby.

The above method can be utilized in a dynamic recycling system. The absorption values of contaminant ions in the recycled solution between 220 nm and 250 nm are measured each time, thereby obtaining an updated wavelength-absorption relationship for TMAH adjustment.

Third Embodiment

Figure 6:
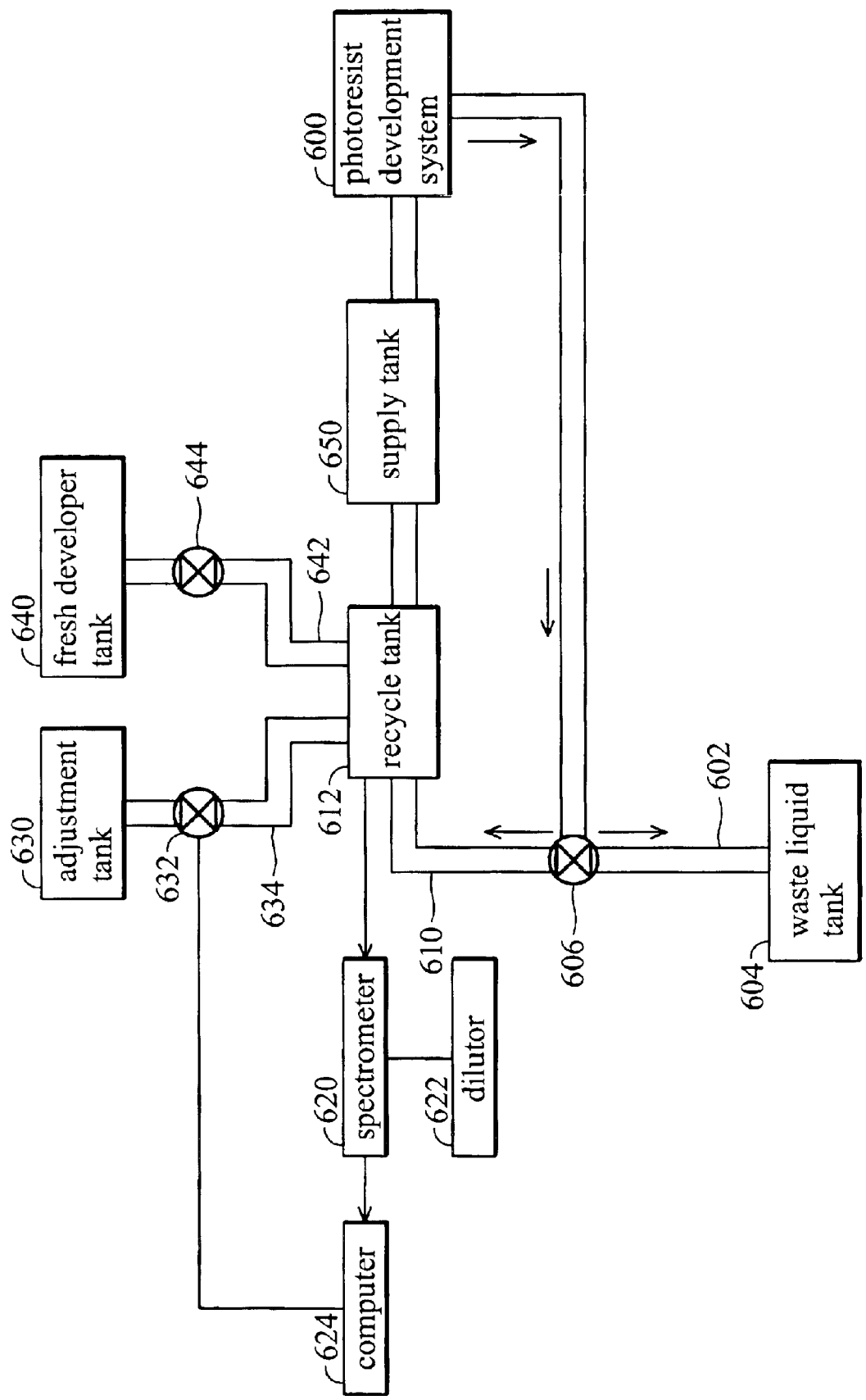
FIG. 6 illustrates a system structure for recycling a TMAH developer solution according to the invention.

A recycling system for TMAH utilizing the recycling method described in the first embodiment is further described with reference to FIG. 6, illustrating a system structure for recycling a TMAH developer solution of the invention.

As shown in FIG. 6, a recycle tank 612 stores the recycled developer solution from a photoresist development system 600 via a recycle pipeline 610. The recycled developer solution can also be discharged from a discharging pipeline 602 to a waste liquid tank 604. The switch between the recycle pipeline 610 and the discharging pipeline 602 is controlled by a gate valve 606.

The recycling system also includes an adjustment tank 630 for loading with highly concentrated TMAH, such as 25% TMAH solution, and connected to the recycle tank 612 with an adjustment pipeline 634 for importing TMAH. The adjustment pipeline 634 is controlled by a gate valve 632. Preferably, the recycle tank 612 is further connected to a fresh developer tank 640 importing fresh standard TMAH developer solution, such as 2.36% TMAH, to the recycle tank 612 via pipeline 642. When the developer solution is drained away from the photoresist development system 600 via the discharge pipeline 602, the fresh standard TMAH developer solution can be supplied by the fresh developer tank 640.

A UV spectrometer 620 is coupled to the recycle tank 612 to measure absorption values of the developer solution in the recycle tank. Preferably, a dilutor 622 is coupled to the UV spectrometer 620 to dilute the sampled recycled solution when any absorption value thereof is greater than 1.2.

A processor, such as computer 624, is connected to the spectrometer 620 and the adjustment pipeline 632. The computer 624 is programmed according to the method described in the first embodiment to calculate TMAH concentration in the recycle tank 612. Co and the absorption calibration curve of TMAH at 210 nm are preset and stored in the computer 624. When the absorption values of the recycled solution at 210 nm and nm A1 and A2 are received from the spectrometer 620, the computer 624 is programmed to compute an absorption value of TMAH in the recycled solution A3 as follows:

$$A3 = A1 - (A2 \times Co)$$

The computer 624 is then programmed to input the absorption value A3 into the absorption calibration curve of TMAH at 210 nm to compute a concentration of TMAH in the recycled solution. If the absorption of the recycled solution is a diluted value, the actual concentration of TMAH is returned according to the dilution ratio.

After the TMAH concentration in the recycled solution is computed, the computer 624 is programmed to calculate a supplementary volume (V) of the highly concentrated TMAH for the recycle tank 612 according to the volume of the recycled solution and the TMAH concentration in the recycle tank 612. The computer 624 opens gate valve 632 to import highly concentrated TMAH with volume V to the recycle tank 612, thereby adjusting the TMAH concentration in the recycled solution to the predetermined concentration, 2.36%.

The adjusted recycled solution is then imported to the supply tank 650 for subsequent photolithography on the photoresist development system 600.

Fourth Embodiment

Another recycling system for TMAH utilizing the recycle method described in the second embodiment is further described based on the system structure shown in FIG. 6.

The computer 624 is programmed according to the method described in the second embodiment to calculate TMAH concentration in the recycle tank 612. The computer 624 is programmed to read absorption values A1, Y1 to Ym at 210 nm and m wavelengths between 220 nm and 250 nm of the recycled developer solution from the spectrometer 620 respectively. Preferably, m is equal to or larger than 2. In an embodiment, absorption values Y1 to Y7 at 220 nm; 225 nm, 230 nm, 235 nm, 240 nm, 245 nm and 250 nm are accessed from the spectrometer 620 and then input to an nth-degree polynomial to generate a wavelength-absorption relationship $Y = C_1 X^n + \ldots + C_{n-1} X + C_n$, wherein X is wavelength, n is a positive integer and $C_1$ to $C_n$ are coefficients of the relationship. In an embodiment, absorption values Y1 to Y7 are input into a 3rd-degree polynomial, $$Y = C_1 X^3 + C_2 X^2 + C_3 X + C_4.$$

The computer 624 is programmed to input wavelength 210 nm into the wavelength-absorption relationship to generate an absorption value $Y_{210}$. A difference A3 between A1 and $Y_{210}$ is then calculated as the absorption value of TMAH in the recycled solution. The computer 624 is programmed to input A3 to a preset absorption calibration curve of TMAH at 210 nm to generate a corresponding TMAH concentration in the recycle tank 612. If the absorption of the recycled solution is a diluted value, the actual concentration of TMAH is returned according to the dilution ratio.

After the TMAH concentration in the recycled solution is computed, the computer 624 is programmed to calculate a supplementary volume (V) of the highly concentrated TMAH for the recycle tank 612 according to the volume of the recycled solution and the TMAH concentration in the recycle tank 612. The computer 624 opens gate valve 632 to import highly concentrated TMAH with volume V to the recycle tank 612, thereby adjusting the TMAH concentration in the recycled solution to the predetermined concentration, 2.36%.

The recycle method and system of the present invention allows calculation of an accurate TMAH concentration in the recycled solution without other ions' influence. Thus, the adjustment of TMAH in the recycled solution is more accurate. Moreover, the spectrometer and processor, such as a computer, provides an economic solution to estimate TMAH concentration than costly ion chromatography.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of recycling a photoresist developer solution containing tetra-methyl-ammonia hydroxide (TMAH), comprising:

selecting m wavelengths between 220 nm and 250 nm, wherein m is equal to or larger than 2;

measuring absorption values Y1 to Ym of the recycled developer solution at the m wavelengths respectively and an absorption value A1 at wavelength 210 nm;

inputting the Y1 to Ym to an nth-degree polynomial, $Y = C_1 X^n + \ldots + C_{n-1} X + C_n$, to generate a wavelength-absorption relationship, wherein X is wavelength, n is a positive integer, and $C_1$ to $C_n$ are coefficients of the relation;

inputting wavelength 210 nm into the wavelength-absorption relationship to generate an absorption value $Y_{210}$;

calculating a difference A3 between the A1 and $Y_{210}$ as the absorption value of TMAH in the developer solution;

inputting A3 to an absorption calibration curve of TMAH at 210 nm to generate a corresponding TMAH concentration; and adding TMAH into the recycled developer solution according to the corresponding TMAH concentration for reuse.

2. The method as claimed in claim 1, wherein the m wavelengths are selected with an interval of 5 nm or 10 nm.

3. The method as claimed in claim 2, wherein the m wavelengths are the 7 wavelengths 220 nm, 225 nm, 230 nm, 235 nm, 240 nm, 245 nm and 250 nm.

4. The method as claimed in claim 1, wherein the nth-degree polynomial is a 2nd- to 5th-degree polynomial.

5. The method as claimed in claim 4, wherein the nth-degree polynomial is a 3rd-degree polynomial as in $Y = C_1 X^3 + C_2 X^2 + C_3 X + C_4$.

6. The method as claimed in claim 1, further comprising the steps of:
   diluting the recycled developer solution when the absorption value A1 at the wavelength 210 nm exceeds 1.2;
   re-measuring absorptions of the diluted recycled developer solution at the m wavelength and 210 nm as Y1 to Ym and A1.

7. A method for recycling a photoresist developer solution containing tetra-methyl-ammonia hydroxide (TMAH), comprising:
   measuring absorption values A1 and A2 of the recycled developer solution at wavelength 210 nm and 220 nm;
   calculating an absorption value A3 of TMAH in the developer solution by A3=A1−A2×Co, wherein Co=(A1'−A3')/A2', A1' and A2' are absorption values of a recycled developer solution with known TMAH concentration at wavelengths 210 nm and 220 nm respectively, and A3' is the standard absorption value of the known TMAH concentration at 210 nm;
   inputting A3 to an absorption calibration curve of TMAH at 210 nm to generate a corresponding TMAH concentration; and
   adding TMAH into the recycled developer solution according to the corresponding TMAH concentration for reuse.

8. The method as claimed in claim 7, further comprising the steps of:
   diluting the recycled developer solution when the absorption value A1 at the wavelength 210 nm exceeds 1.2;
   re-measuring absorptions of the diluted recycled developer solution at wavelengths 210 nm and 220 nm as A1 and A2.

9. A recycling system of a photoresist developer solution containing tetra-methyl-ammonia hydroxide (TMAH), comprising:
   a recycle tank collecting the recycled developer solution from a photoresist development system via a recycle pipeline;
   an adjustment tank loaded with highly concentrated TMAH and connected to the recycle tank with an adjustment pipeline;
   a spectrometer for measuring absorption values of the developer solution in the recycle tank;
   a processor connecting to the spectrometer and the adjustment pipeline, programmed to calculate a TMAH concentration in the recycle tank according to the measured absorption values from the spectrometer and delivering an amount of highly concentrated TMAH from the adjustment pipeline to the recycle tank to achieve a desired TMAH concentration according to the calculated TMAH concentration, wherein the processor is programmed to calculate the TMAH concentration in the recycle tank by the following steps:
   reading absorption values Y1 to Ym on m wavelengths between 220 nm and 250 nm of the recycled developer solution respectively, wherein m is equal to or larger than 2, and an absorption value A1 of 210 nm;
   inputting the Y1 to Ym to an nth-degree polynomial to generate a wavelength-absorption relationship $Y=C_1X^n+\ldots+C_{n-1}X+C_n$, wherein X is wavelength, n is a positive integer and $C_1$ to $C_n$ are coefficients of the relation;
   inputting wavelength 210 nm into the wavelength-absorption relationship to generate an absorption value $Y_{210}$;
   calculating a difference A3 between the A1 and $Y_{210}$ as the absorption value of TMAH in the developer solution; and
   inputting A3 to an absorption calibration curve of TMAH at 210 nm to generate a corresponding TMAH concentration in the recycle tank.

10. The recycling system as claimed in claim 9, wherein the processor is a computer.

11. The recycling system as claimed in claim 9, wherein the m wavelengths are selected with an interval of 5 nm or 10 nm.

12. The recycling system as claimed in claim 11, wherein the m wavelengths are the 7 wavelengths 220 nm, 225 nm, 230 nm, 235 nm, 240 nm, 245 nm and 250 nm.

13. The recycling system as claimed in claim 9, wherein the nth-degree polynomial is a 2nd- to 5th-degree polynomial.

14. The recycling system as claimed in claim 13, wherein the nth-degree polynomial is a 3rd-degree polynomial as in $Y=C_1X^3+C_2X^2+C_3X+C_4$.

15. The recycling system as claimed in claim 9, further comprising a dilutor for diluting the recycled developer solution when the absorption value A1 at the wavelength 210 nm exceeds 1.2.

16. A recycling system of a photoresist developer solution containing tetra-methyl-ammonia hydroxide (TMAH), comprising:
   a recycle tank collecting the recycled developer solution from a photoresist development system via a recycle pipeline;
   an adjustment tank loaded with highly concentrated TMAH and connected to the recycle tank with an adjustment pipeline;
   a spectrometer for measuring absorption values of the developer solution in the recycle tank;
   a processor connected to the spectrometer and the adjustment pipeline, programmed to calculate a TMAH concentration in the recycle tank according to the measured absorption values from the spectrometer and delivering an amount of highly concentrated TMAH from the adjustment pipeline to the recycle tank to achieve a desired TMAH concentration according to the calculated TMAH concentration, wherein the processor is programmed to calculate the TMAH concentration in the recycle tank by the following steps:
   reading absorption values A1 and A2 of the recycled developer solution at wavelength 210 nm and 220 nm;
   calculating an absorption value A3 of TMAH in the developer solution by A3=A1−A2×Co, wherein Co=(A1'−A3')/A2', A1' and A2' are absorption values of a recycled developer solution with known TMAH concentration at wavelengths 210 nm and 220 nm respectively, and A3' is the standard absorption value of the known TMAH concentration at 210 nm;
   inputting A3 to an absorption calibration curve of TMAH at 210 nm to generate a corresponding TMAH concentration in the recycle tank.

17. The recycling system as claimed in claim 16, wherein the processor is a computer.

18. The recycling system as claimed in claim 16, further comprising a dilutor for diluting the recycled developer solution when the absorption value A1 at the wavelength 210 nm exceeds 1.2.

* * * * *